United States Patent [19]

Yamada et al.

[11] Patent Number: 5,156,985

[45] Date of Patent: Oct. 20, 1992

[54] METHOD FOR MAKING A CHARGE TRANSFER SEMICONDUCTOR DEVICE HAVING AN OBLONG TRENCH

[75] Inventors: Takahiro Yamada, Hirakata; Tadashi Sugaya, Nara, both of Japan

[73] Assignee: Matsushita Electric Industrial Co., Ltd., Kadoma, Japan

[21] Appl. No.: 696,954

[22] Filed: May 8, 1991

[30] Foreign Application Priority Data

May 8, 1990 [JP] Japan .................. 2-118903

[51] Int. Cl.$^5$ ................ H01L 21/339; H01L 21/266
[52] U.S. Cl. ...................... 437/35; 437/53; 437/150; 437/157
[58] Field of Search ............. 437/27, 35, 36, 50, 437/53, 149, 150, 157; 357/24

[56] References Cited

U.S. PATENT DOCUMENTS

| 4,374,455 | 2/1983 | Goodman | 437/36 |
| 4,580,331 | 4/1986 | Soclof | 437/35 |
| 5,029,321 | 7/1991 | Kimura | 357/24 |

FOREIGN PATENT DOCUMENTS

| 0012162 | 1/1988 | Japan . | |
| 63-12162 | 1/1988 | Japan . | |
| 0227036 | 9/1988 | Japan | 437/35 |
| 0078272 | 3/1990 | Japan . | |
| 2-78272 | 3/1990 | Japan . | |

Primary Examiner—Olik Chaudhuri
Assistant Examiner—C. Chaudhari
Attorney, Agent, or Firm—Cushman, Darby & Cushman

[57] ABSTRACT

In making trench type semiconductor CCD by using oblique ion-injections into an oblong trench groove in a semiconductor substrate region for injecting impurity atoms, an injection angle $\alpha$ for injecting a first conductivity type impurity to form isolation region into the side walls and also for injecting a second conductivity type impurity to form a charge transfer region thereon is selected less than $\pi/4$, and another injection angle $\beta$ for injecting the same impurity into the end wall to form the end part of the isolation region and a third injection angle $\gamma$ for injecting the second conductivity type impurity thereon into the end wall to form the end part of the charge transfer region are selected:

$$\beta + \gamma = \frac{\pi}{2} \text{ and } \beta \leq \gamma.$$

3 Claims, 6 Drawing Sheets

FIG.3 (a)(Prior Art)
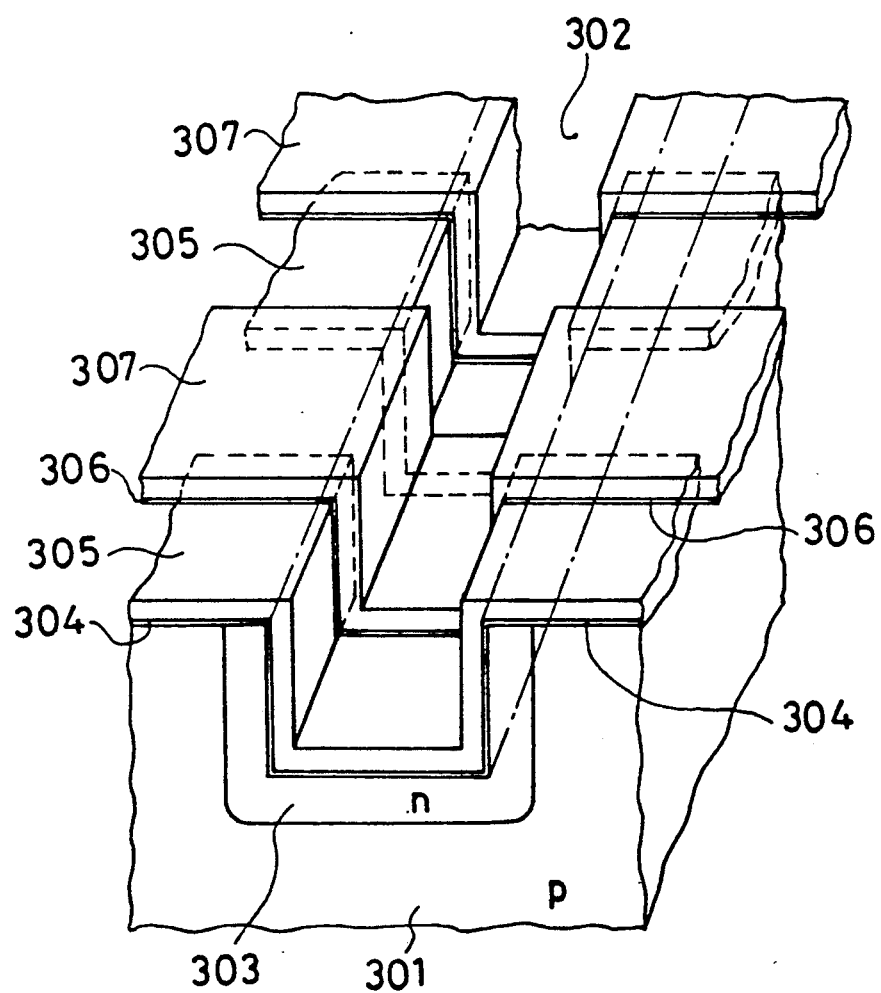

METHOD FOR MAKING A CHARGE TRANSFER SEMICONDUCTOR DEVICE HAVING AN OBLONG TRENCH

FIELD OF THE INVENTION AND RELATED ART STATEMENT

1. Field of the Invention

The present invention relates to method for making a semiconductor device, and more particularly to method for making a charge transfer semiconductor device.

2. Description of the Related Art

FIG. 3(a) is a perspective view showing a part of a conventional charge transfer semiconductor device having an oblong trench (hereinafter this type of the semiconductor device is referred to as a trench CCD) which is disclosed in a Japanese patent application Sho 61-156630 (Japanese unexamined published patent application Sho 63-12162). This conventional trench CCD has an oblong trench 302 formed in a P-type substrate 301, wherein N-type region 303 as a charge transfer region is formed, an insulation film 304, which is formed on the inner faces of the N-type region 303 covering the trench and extending above the principal face of the substrate 301, first transfer electrodes 305, 305 ... and second transfer electrodes 307, 307 ... which are each other isolated by second insulation films 306.

FIG. 3(b) shows a schematic plan view of a trench type CCD imaging apparatus which has an output amplifier 335 and the trench CCD device of the type shown in FIG. 3(a) as its vertical CCD part, which apparatus is disclosed in the Japanese patent application Sho 63-230441 (Japanese unexamined published patent application Hei 2-78272 Tokkai Hei 2-78272). This trench type CCD imaging apparatus has photoelectric conversion regions 331, trench type vertical CCD part 332, which together constitute a photo-reception part 333, a planar type horizontal CCD part 334 and the output amplifier 335.

Making of the above-mentioned conventional trench CCD device is elucidated with reference to FIG. 4(a) and FIG. 4(b).

As shown in FIG. 4(a), by utilizing an insulation film 401 formed on the p-conductivity type substrate 301 as etching-mask, the substrate 301 is etched by means of RIE (reactive ion etching), to form a trench type groove 302. Then as shown in FIG. 4(b), arsenic as n-conductivity type impurity is implanted by oblique implantation on the inner walls of the trench 302, followed by a heat treatment or annealing to activate the arsenic. Thereby the n-conductivity type region 303 is formed as the charge transfer region. Next, as shown in FIG. 4(c), after forming the insulation film 304 as gate oxide film, a polysilicon film is deposited thereon to form the first transfer electrode 305. And then, by repeating the similar formation of the other insulation film 306 and polysilicon film the second transfer electrode 307 are formed. Next, after forming still other insulation film 402 in the inside wall of the trench and on the substrate, polysilicon 403 is filled in the hollow space in the trench to make the substrate face flat.

The above-mentioned conventional manufacture process of the semiconductor device has the following problem with regard to process of ion-injection to dope impurities.

<i> When the oblique ion implantation is made for a trench having a narrow trench width, the injection angle against normals to the side walls or end wall becomes smaller than that against the normal line to the bottom wall. Therefore, when the oblique injections are made to the side walls or end wall, the bottom wall is likely to be ion-injected with unnecessarily high per area density of the impurity in comparison with those of the side walls and/or end wall.

As shown in a computation model graph of FIG. 5 for the relation between the ratio of bottom-wall impurity-concentration/side-wall impurity-concentration (graduated on abscissa) vs. maximum transferable charge (graduated on ordinate), when the impurity density of the bottom wall is higher than the side walls and/or end wall, the transferable charge doses decreases considerably in the range of the ratio which is larger than 1.

<ii> Since n-type trench CCD cannot be electrically isolated from neighboring n-conductivity type region, intended very high integration to form an imaging apparatus is difficult.

SUMMARY OF THE INVENTION

The present invention purposes to provide an improved method for making a semiconductor device which can provide a semiconductor device having an ideal impurity concentration distribution of charge transfer regions.

The method for making a semiconductor device in accordance with the present invention comprises a first step of forming an oblong trench groove having an end wall by etching a semiconductor substrate, a second step of an oblique ion-injection for injecting impurity atoms of a first conductivity type at an injection angle $\alpha$, which angle enables injection only into a first side wall in oblong direction of the trench groove, a third step of an oblique ion-injection for injecting impurity atoms of the first conductivity type at the injection angle $\alpha$ into a second side wall in oblong direction disposed opposing to the first side wall, a fourth step of an oblique ion-injection for injecting impurity atoms of the first conductivity type at an injection angle $\beta$ into the bottom face and into the end wall, the second step, the third step and the fourth step together being for forming an electric isolation region, a fifth step of an oblique ion-injection for injecting impurity atoms of a second conductivity type which is opposite to the first conductivity type at the injection angle $\alpha$ into the first side wall, a sixth step of an oblique ion-injection for injecting impurity atoms of the second conductivity type at the injection angle $\alpha$ into the second side wall, a seventh step of an oblique ion-injection for injecting impurity atoms of the second conductivity type at an injection angle $\gamma$ into the bottom face and into the end wall, an eighth step of forming insulation films on the wall faces of the trench groove and a ninth step of forming plural transfer electrodes on the wall faces covered by the insulation films.

According to the present invention, on the inner side walls and bottom face of the oblong trench, the electrically isolated region and charge transfer film formed thereon are formed in self-alignment. And that, impurity concentrations of the inner side walls and the end wall of the trench can be controlled accurately to desired values by means of oblique ion implantations, wherein selection of angle of oblique ion implantation is made to particular angles determined in accordance with the rule given by the present invention, and thereby imaging apparatus of trench type CCD of a high integration can be manufactured with high production yield.

BRIEF DESCRIPTION OF THE DRAWINGS

FIG. 1(a), FIG. 1(b), FIG. 1(c), FIG. 1(d) and FIG. 1(e) are sectional views of a preferred embodiment of the present invention wherein FIG. 1(a) is a plan view, FIG. 1(b) is a elevation front view, FIG. 1(c) is an elevation side view, FIG. 1(d) is an elevation front view in a later step and FIG. 1(e) is an elevation side of the later step.

FIG. 3(a) is the perspective view of a part of the conventional semiconductor device having trench CCD.

It will be recognized that some or all of the Figures are schematic representations for purposes of illustration and do not necessarily depict the actual relative sizes or locations of the elements shown.

DESCRIPTION OF THE PREFERRED EMBODIMENT

Hereafter, a preferred embodiment of the present invention is described in detail with reference to the accompanying drawings of FIG. 1 through FIG. 2.

FIG. 1 shows a manufacturing method of a semiconductor device, which has a long trench groove, for instance a CCD device, as a first embodiment in accordance with the present invention.

<1> Oblique ion-injection of a first (p-) conductivity type impurity atoms (boron)

Figure 1B:
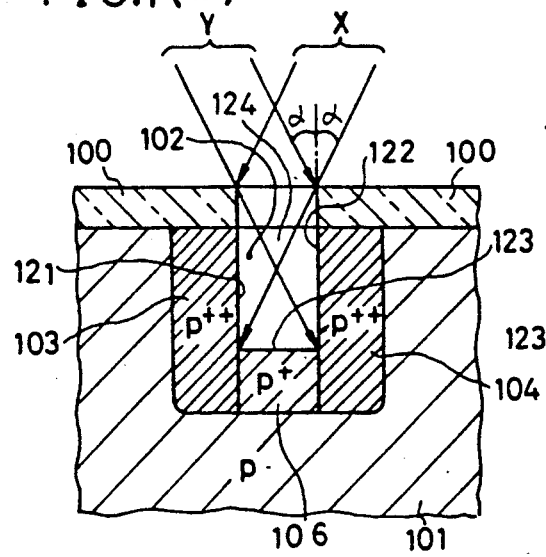
Figure 1C:
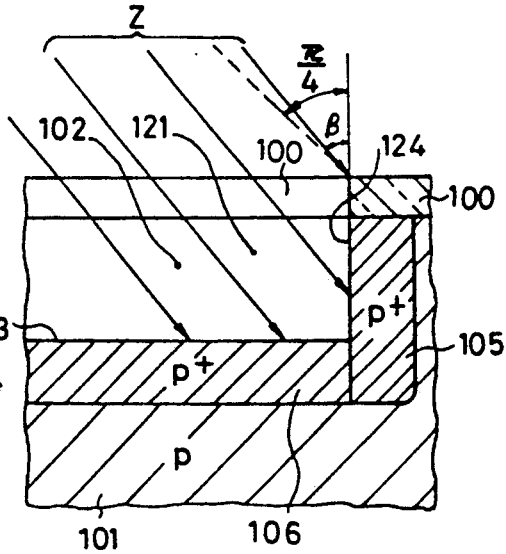
Figure 1A:
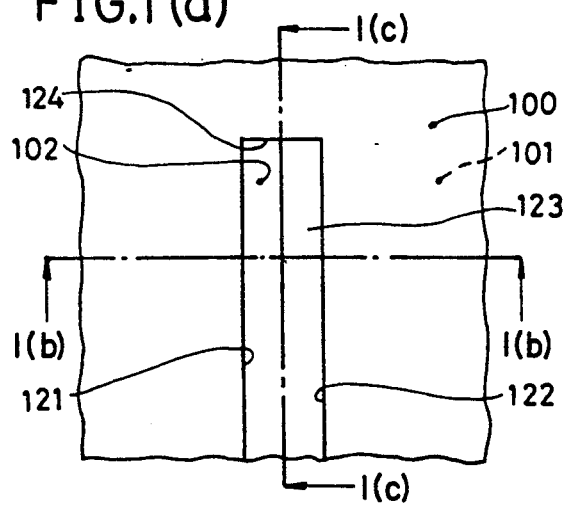

In FIG. 1(a) is a plan view of a main part of the wafer having an oblong trench groove 102. FIG. 1(b) is a sectional front view taken at a sectional plane which is perpendicular to a direction of the oblong trench groove. FIG. 1(c) is a sectional side view showing the wafer 101 of FIG. 1(a) and FIG. 1(b).

The long trench groove 102 is formed on a p-type substrate region by known RIE (reactive ion etching) method, by utilizing an insulation film 100 on the substrate 101 as etching mask.

As shown in the example of FIG. 1, a first oblique ion-injection is made into each of both side walls 121 and 122 of the trench groove 102, at an injection angle $\alpha$ against each vertical plane, which is an extension of each side walls 121, 122, and is vertical to the principal surface of the wafer 101, to inject impurity atoms of boron as a first conductivity type (p-conductivity type), from X direction and Y direction as shown in FIG. 1(b). Thereby, as shown in FIG. 1(b) p-conductivity type regions 103 and 104 are formed by self-alignment method on both side walls 121 and 122 of the trench groove 102. The resultant p-conductivity type regions 103 and 104 form a pair of p+-conductivity type isolation regions 103 and 104 for preventing punch-through between adjacent CCD.

Next, as shown in FIG. 1(c), the ion-injection of boron atoms as the first (p-) conductivity type impurity is made as shown by arrow lines Z into the end wall 124 of the trench groove 102 with an injection angle $\beta$ against a vertical plane, which is an extension of the end wall 124 and is vertical to the principal surface of the wafer 101. The angle $\beta$ is selected, $\pi/4$ or less. Thus, as shown in FIG. 1(c), the boron injection is made in the end wall 124 and in the bottom face 123, to produce p-conductivity type regions 105 and 106, respectively. The bottom p-conductivity type region 106 is formed as the isolation region having higher conductivity than the end wall p-conductivity type region 105.

In general, as the isolation region for the trench CCD, it is desirable that the p-conductivity type regions 103 and 104 on the side walls 121 and 123, respectively have higher impurity concentration than that of the p-conductivity type bottom region 106 on the bottom wall 123. Such constitution results in realization of electric isolations between the trench type CCDs of n-conductivity type and photo diodes of n-conductivity type by the p-conductivity regions 103 and 104, in case the device is the trench type CCD imaging device having trench CCDs of n-conductivity type in p-conductivity wells on an n-conductivity substrate. Also, the bottom region 106 realizes electric isolations between the trench CCDs and the n-conductivity type substrate region 101.

Subsequently, oblique ion-injections of the second (n-) conductivity type impurity atoms are made as follows.

<2> Oblique ion-injection of a second (n-) conductivity type impurity atoms (As or P)

Figure 1D:
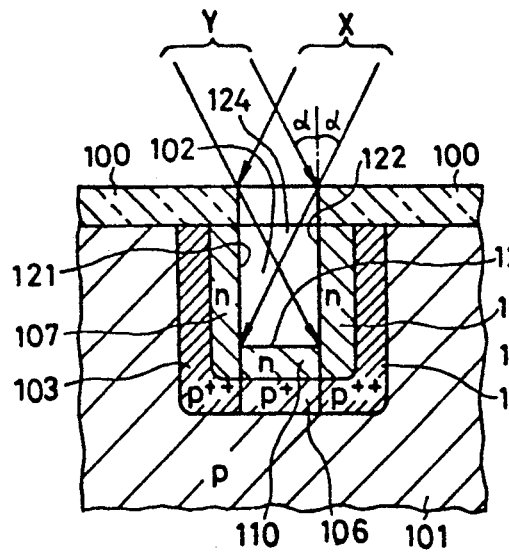

As shown in FIG. 1(d), into both side walls 103 and 104 of the trench groove 102, atoms of As (arsenic) or P (phosphor) as the second (n-) conductivity type impurity are obliquely ion-injected with the injection angle $\alpha$ as shown by arrow lines X and Y in FIG. 1(d). And thereby n-conductivity type regions 107 and 108 are formed on the side walls 121 and 122 of the trench groove 102, respectively, in self-alignment.

Figure 1E:
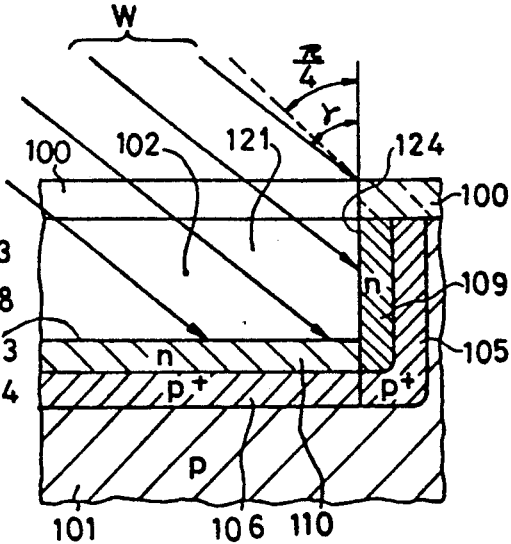

Thereafter, into the end wall 124 of the trench groove 102, the As or P atoms as the second (n-) conductivity impurity is obliquely ion-injected at the injection angle $\gamma$ which is $\pi/4$ or larger, as shown by arrow lines W of FIG. 1(e). Thereby as shown in FIG. 1(e), the oblique ion-injections are made on the end wall 124 and the bottom wall 123 to form n-conductivity type regions 109 and 110, in a manner that the n-conductivity type impurity concentration in the n type region 109 is higher than that in the region 110.

As the charge transfer region of the trench CCD, it is desirable that the impurity concentration of the n-regions 107 and 108 are lower than that of the region 109, and higher than that of the region 110. The reason is that ideal charge transfers are carried out evading formings of undesirable potential wells, by selecting the order of position where more signal charges accumulate in such order as first the end wall part, second the side wall part and lastly the bottom wall part.

In recent trends of scaling to miniature sizes of the semiconductor devices, the trench widths are to be decreased further and further. Therefore, the bottom wall part of the charge transfer regions in the trench groove is losing their function. Hence, it is desirable to select that the impurity concentration of the side wall parts is equal to or lower than those of the end wall part, and further the impurity concentration of the bottom wall parts are selected to be lower than those of the side wall parts and the end wall parts, in order to make the current distribution uniform in all parts of the charge transfer regions.

Figure 2:
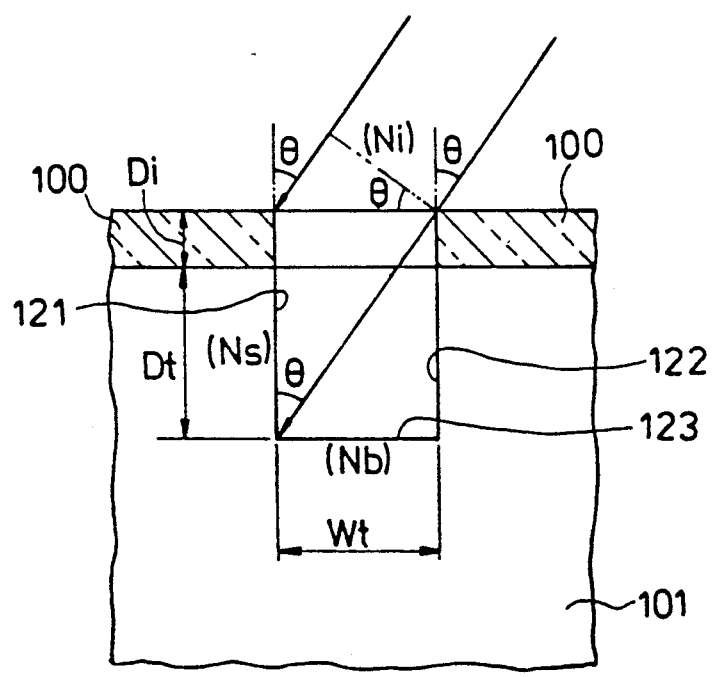
FIG. 2 is a schematic sectional front view elucidating oblique ion-injection.
Figure 3B:
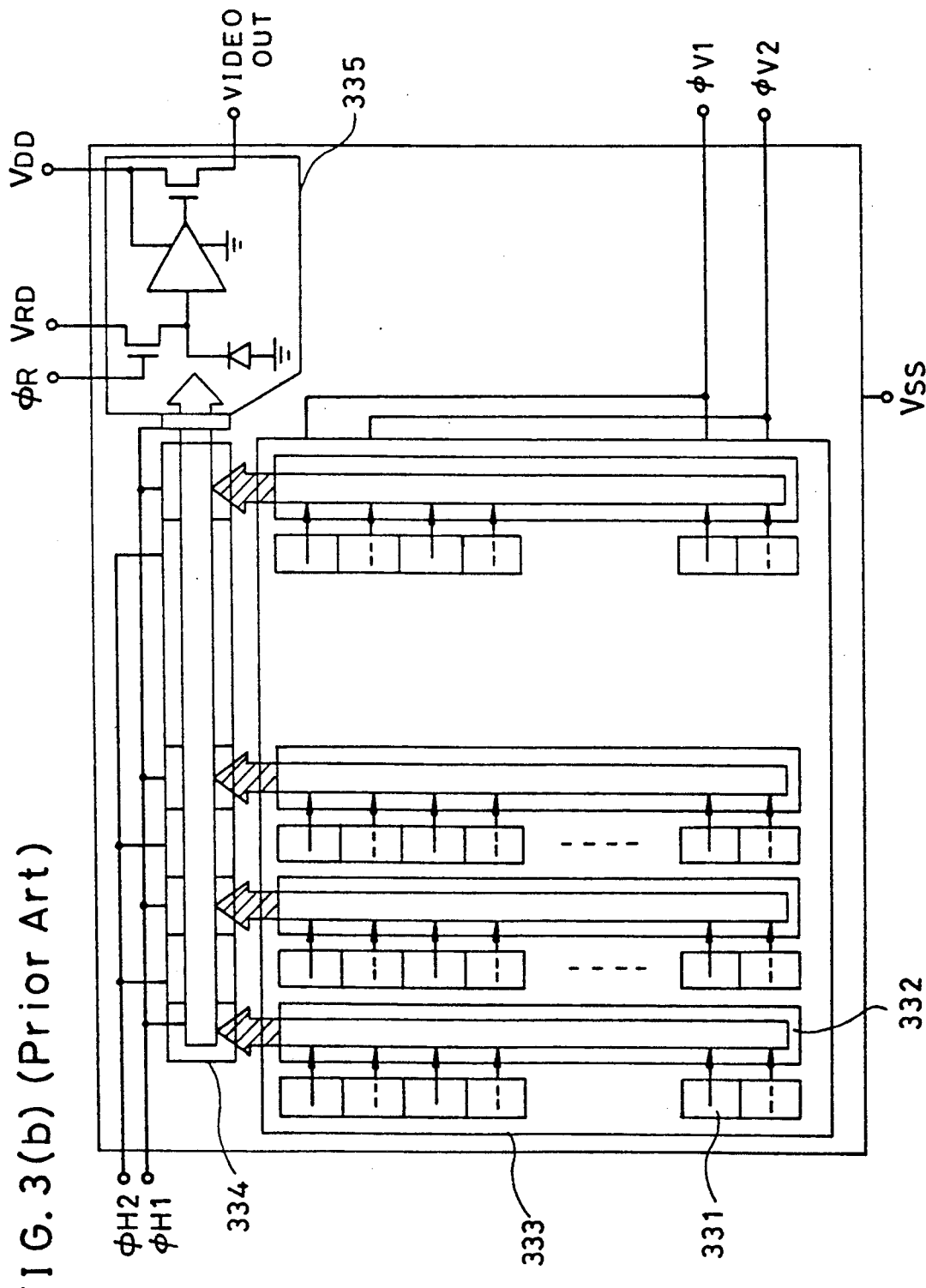
FIG. 3(b) is the plan view of the conventional trench type CCD imaging apparatus having the trench CCD of FIG. 3 therein.
Figure 4A:
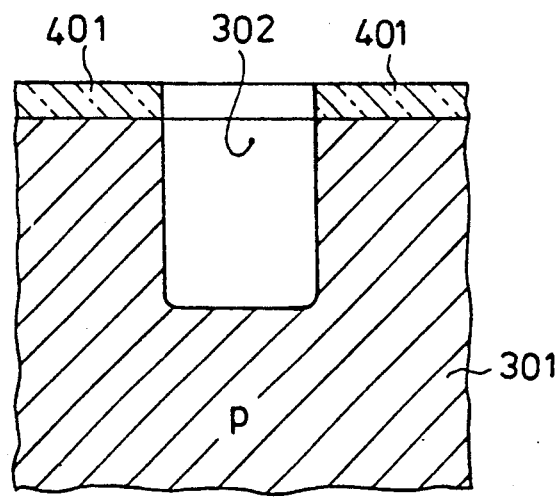
FIG. 4(a) is the sectional elevation front view showing an early step of making the conventional trench CCD illustrating manufacture of the CCD semiconductor device.
Figure 4B:
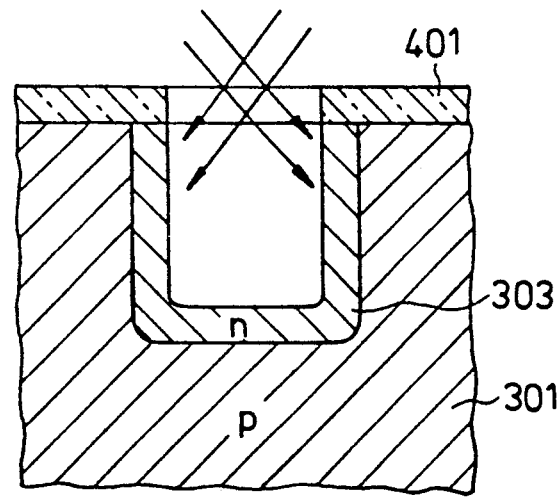
FIG. 4(b) is the sectional elevation front view of the making method of the trench CCD of FIG. 4(a) in the later step.
Figure 4C:
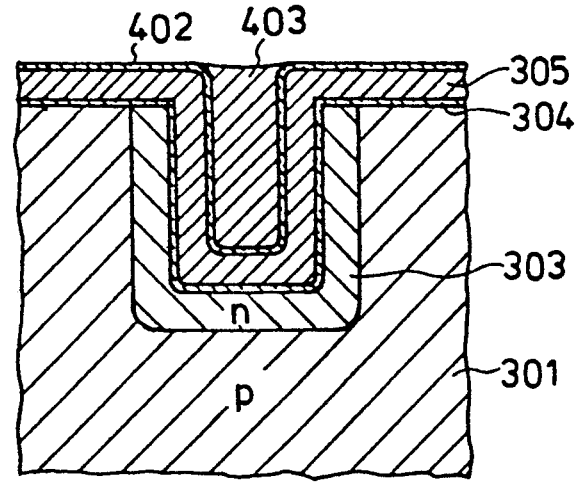
FIG. 4(c) is the sectional elevation front view of the making method of the trench CCD of FIG. 4(a) in the substantially final step.
Figure 5:
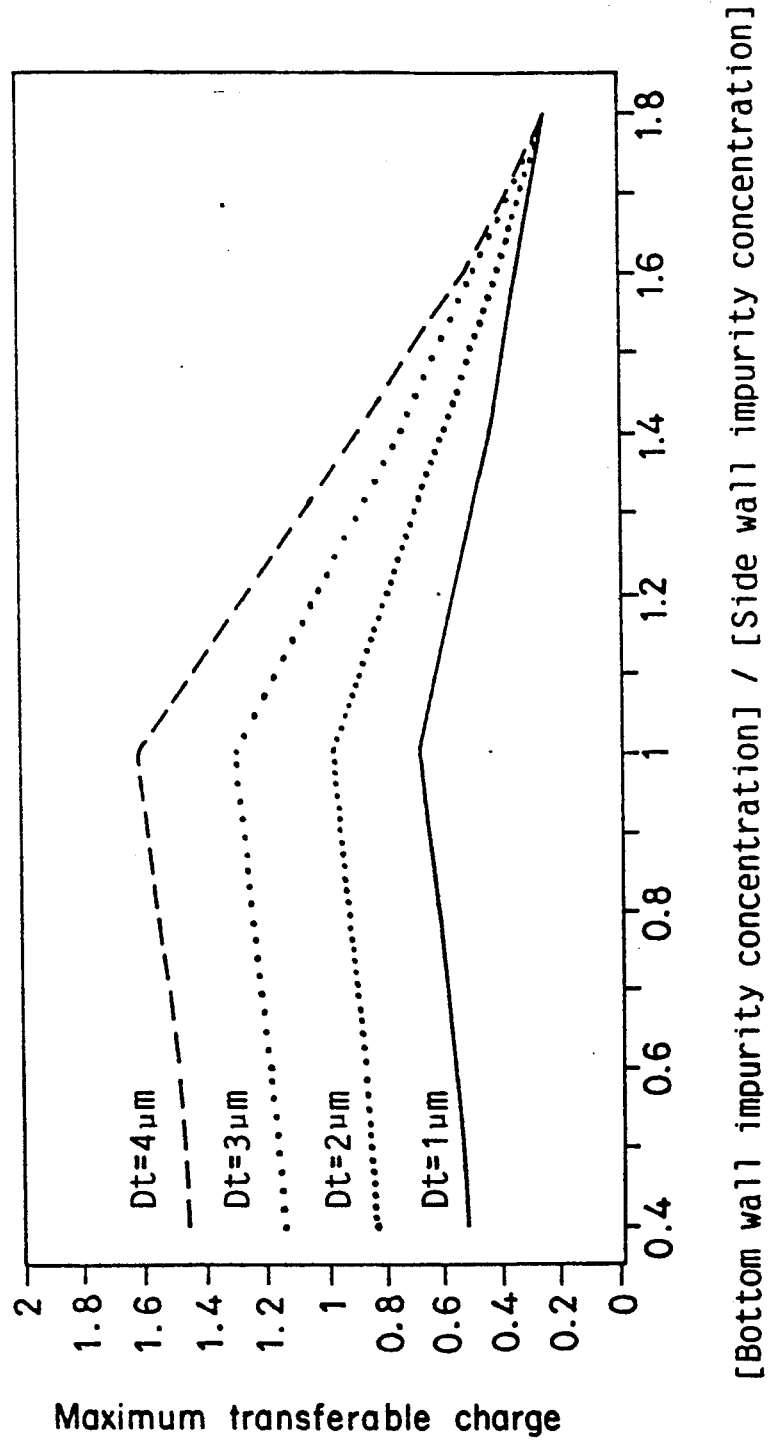
FIG. 5 is graph showing the relation between the ratio of bottom-wall impurity-concentration/side-wall impurity-concentration (on abscissa) vs. maximum transferable charge (on ordinate) of the conventional device.

FIG. 2 schematically shows oblique ion-injection made into a side wall of a narrow trench groove of a trench CCD.

The impurity implantation doses of ion-injection in accordance with the present invention can be estimated as follows with reference to FIG. 1 and FIG. 2:

$$\tan\theta = \frac{Wt}{Dt + Di}, \tag{1}$$

wherein: $\theta$ collectively represents injection angle $\alpha$, $\beta$ or $\gamma$ measured from vertical lines on the side wall plane or end wall plane which line is normal to the principal face of the wafer; Dt represents trench depth; Wt represents trench width; and Di represents thickness of the insulation film 100 around the opening of the trench groove.

Then impurity implantation doses Ni when the ions are injected at the injection angle $\theta$ is given by the below-mentioned equation (2).

$$Ni = \frac{Ns}{\tan\theta \times \cos\theta} = \frac{Ns}{\sin\theta}, \tag{2}$$

wherein Ns is implantation doses of the n-conductivity type impurity to be injected to the side wall of the trench groove 102. This equation (2) shows that the doses Ns of impurity injected to the side walls is given by $$Ns = Ni \cdot \sin\theta \tag{2A}.$$

Similarly, the doses Nb of impurity injected to the bottom walls is given by $$Nb = Ni \cdot \cos\theta \tag{2B}.$$

<3> Angles of oblique ion-injections of impurity atoms at angles $\alpha$, $\beta$ and $\gamma$ The ion-injection angles $\alpha$, $\beta$ and $\gamma$ are defined and selected as follows.

$\alpha$—is an oblique ion-injection angle wherewith only one side wall 121 or 122 is ion-injected, and that $\alpha$ is less than 45°, that is $$\alpha < 45° \tag{3},$$

$\beta$—is an oblique ion-injection angle wherewith both one end wall 124 and the bottom wall 123 are simultaneously ion-injected, and that $\beta$ is equal to or less than 45°, that is $$\beta \leq 45° \tag{4},$$

and $\gamma$—is an oblique ion-injection angle wherewith both one end wall 124 and the bottom wall 123 are simultaneously ion-injected, and that $\gamma$ is equal to or larger than 45°, that is $$\gamma \geq 45° \tag{5}.$$

<4> Three steps of oblique ion-injections of p-conductivity type impurity atoms at injection angles $\alpha$, $\alpha$ and $\beta$, respectively In order to form electric isolation regions in self-alignment method on the walls in the trench groove 102, firstly, the p-conductivity type impurity atoms (e.g. boron) are ion-injected on each of the mutually opposing side walls 121, 122 which are disposed parallel to the direction of the oblong trench groove 102, each at the oblique injection angles $\alpha$ and $\alpha$; and subsequently the p-conductivity type impurity atoms (e.g. boron) are ion-injected to the end wall and the bottom wall, at the oblique injection angle $\beta$.

By defining the implantation doses of p-conductivity type impurities during the injections at the oblique injection angles $\alpha$ and $\beta$ as Npi($\alpha$) and Npi($\beta$), respectively, and further defining the implantation doses of impurity at the depth x from the surface of the silicon wafer at the oblique injection angles $\alpha$ and $\beta$ as Npi($\alpha$,x) and Npi($\beta$,x), respectively, the following relations hold:

impurity doses Nps on the side wall 121 or 122 is
$$Nps = Npi(\alpha,x) \cdot \sin\alpha \tag{6.1},$$

impurity doses Npt on the end wall 124 is
$$Npt = Npi(\beta,x) \cdot \sin\beta \tag{6.2},$$

and impurity doses Npb on the bottom wall 123 is
$$Npb = Npi(\beta,x) \cdot \cos\beta \tag{6.3}$$

and that $$Npi(\beta,x) \cdot \sin\beta \leq Npi(\beta,x) \cdot \cos\beta \quad * \quad Npi(\alpha,x) \cdot \sin\alpha \tag{6}.$$

The inequity relation of the right hand inequity symbol marked by * is necessary from a requirement for prevention of an undesirable production of potential barrier produced by charges, which are transferred along the transfer regions 107, 108 on the side walls 121, 122 of the trench groove 102 of the CCD and then flow over the end wall region 109.

<5> Three steps of oblique ion-injections of n-conductivity type impurity atoms at injection angles $\alpha$, $\alpha$ and $\gamma$, respectively In order to form charge transfer regions in self-alignment method on the walls in the trench groove 102, firstly, the n-conductivity type impurity atoms (e.g. arsenic or phosphor) are ion-injected on each of the mutually opposing side walls 121, 122 which are disposed parallel to the direction of the oblong trench groove 102, each at the oblique injection angles $\alpha$ and $\alpha$; and subsequently the n-conductivity type impurity atoms (e.g. of arsenic or phosphor) are ion-injected to the end wall and the bottom wall, at the oblique injection angle $\gamma$.

By defining the doses of n-conductivity type impurities during the injections at the oblique injection angles $\alpha$ and $\gamma$ as $Nni(\alpha)$ and $Nni(\gamma)$, respectively, and further defining the doses of impurity at the depth y from the surface of the silicon wafer at the oblique injection angles $\alpha$ and $\gamma$ as $Nni(\alpha,y)$ and $Nni(\gamma,y)$, respectively, the following relations hold:

impurity doses Nns on the side wall 121 or 122 is
$$Nns = Nni(\alpha,y) \cdot \sin \alpha \tag{7,1}$$

impurity doses Nnt on the end wall 124 is
$$Nnt = Nni(\gamma,y) \cdot \sin \gamma \tag{7,2},$$

and impurity doses Nnb on the bottom wall is $$Nnb = Nni(\gamma,y) \cdot \cos \gamma \tag{7,3},$$

and that $$Nni(\gamma,y) \cdot \sin \gamma \leqq Nni(\gamma,y) \cdot \cos \gamma \quad Nni(\alpha,y) \cdot \sin \alpha \tag{7}$$

The inequity relation of the right hand inequity symbol marked by * is necessary from a requirement for prevention of an undesirable production of potential barrier produced by charges, which are transferred along the transfer regions 107, 108 on the side walls 121, 122 of the trench groove 102 of the CCD and flow over the end wall region 109.

From the above-mentioned relations described in the paragraphs <4> and <5>, the impurity implantation doses in the charge transfer regions are as shown in the following table.

TABLE 1

| Injection angle | $\alpha$ | $\beta$ or $\gamma$ |
|---|---|---|
| Impurity doses in the side wall parts (107, 108) | $[Nni(y) - Npi(x)] \cdot \sin\alpha$ | |
| Impurity doses in the end wall part (109) | | $Nni(y) \cdot \sin\gamma - Npi(x) \cdot \sin\beta$ |
| Impurity doses in the bottom wall part (110) | | $Nni(y) \cdot \cos\gamma - Npi(x) \cdot \cos\beta$ |

<6> One concrete example is as follows:

| | | |
|---|---|---|
| Depth | Dt (of the trench groove 102) is | 1.5 μm, |
| Width | Wt (of the trench groove 102) is | 1.0 μm, |
| Thickness | Di (of the insulation film 100) is | 0.45 μm. |

Then, from the equation (1).

$$\tan\alpha = \frac{wt}{Dt + Di} = \frac{1.0 \, \mu m}{1.5 \, \mu m + 0.45 \, \mu m} = \frac{1.0}{1.95} = 0.51,$$

and hence, $\alpha = 27°$ is given as the preferable injection angle.

And let us assume, for the simplicity of mathematical handling, that $\beta + \gamma = \pi/2$ and that $$\beta = 40°, \gamma = 50° \tag{8}.$$

The impurity concentrations of n-conductivity type at the side wall regions 107 and 108 of the trench groove 102 and the end wall region 124 should be substantially equal to each other. And also the impurity concentrations of p-conductivity type at the side wall regions 103 and 104 and the bottom wall region 106 should be substantially equal to each other, (which equalities correspond to cases of equal symbols marked by * in the afore-mentioned formulas (6) and (7)). In other words, the following relations should hold:

$$Nni(y) \cdot \sin \alpha = Nni(y) \cdot \sin \gamma$$

and $$Npi(x) \cdot \sin \alpha = Npi(x) \cdot \cos \beta.$$

Therefore, in case of ion-injections into the end wall regions (105 and 109), the impurity doses need to be corrected

| | | |
|---|---|---|
| from Nni | to Nni', | and |
| from Npi | to Npi', | | in order to realize the above-mentioned equalities.

By substituting the afore-mentioned values of $\alpha$, $\beta$ and $\gamma$ and by introducing the above-mentioned corrections, the Table 1 is rewritten to Table 2. This Table 2 shows the corrected preferred impurity doses to be ion-injected into the side walls, the end wall and the bottom wall. That is, the Table 2 shows how the correction of the impurity doses is to be determined.

TABLE 2

| Injection angle | $\alpha = 27°$ | $\beta = 50°$ and $\gamma = 40°$ |
|---|---|---|
| Impurity doses in the side wall parts (107, 108) | $0.454[Nni(y) - Npi(x)]$ | |
| Impurity doses in the end wall part (109) | | $0.766Nni(y)' - 0.643Npi(x)'$ |
| Impurity doses in the bottom wall part (110) | | $0.643Nni(y)' - 0.766Npi(x)'$ |

From the contents described in the Table 2 and from the afore-mentioned technical requirement that both n-conductivity type impurity concentrations $Nni(y) \sin \alpha$ (which is the oblique ion-injected n-conductivity type impurity concentration at the depth "y" in the side wall region 103 or 104) and $Nni(y)' \sin \gamma$ (which is the oblique ion-injected n-conductivity type impurity concentration at the depth "y" in the end wall region 109) should be equal to each other, the corrections of the impurity concentrations are determined as follows:

$$0.454Nni(y) = 0.766Nni(y)', \text{ and hence}$$
$$Nni(y)' = 0.592Nni(y) \tag{9},$$

and similarly $$0.454Npi(x) = 0.766Npi(x)', \text{ and hence}$$
$$Npi(y)' = 0.592Npi(y) \tag{10}.$$

Therefore, the impurity concentrations at the oblique ion-injections are to be set as shown in Table 3.

TABLE 3

| Injection angle | $\alpha = 27°$ | $\beta = 50°$ and $\gamma = 40°$ |
|---|---|---|
| Impurity doses in the side wall parts (107, 108) | Nni(y) and NPI(x) | |
| Impurity doses in the end wall part (109) and the bottom wall part (110) | | 0.592Nni(y) and p.592Npi(x) |

From the equations (9) and (10), the preferred impurity concentrations at the oblique ion-injections for various parts of the trench groove 102 are deduced as shown in the Table 3. The injection angles and doses shown in Table 3 fulfill the preferred requirements of the relations (6) and (7).

Therefore, by carrying out oblique ion-injections into various parts of impurities of the trench groove, according to the angles and doses instructed by the Table 3, electric isolation regions (of p-conductivity type) and charge transfer regions (of n-conductivity type) are formed in self-alignment with most desirable impurity concentrations, at a very high controllability, even for a very narrow trench groove. And accordingly, a highly integrated trench CCD can be made with a high production yield.

Although the present invention has been described in terms of the presently preferred embodiments, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. Method for making a semiconductor device comprising the steps of:
   etching a semiconductor substrate to form an oblong trench groove having an end wall;
   forming an electric isolation region comprising the steps of:
   obliquely ion-injecting impurity atoms of a first conductivity type at an injection angle $\alpha$ into a first side wall which is parallel to an oblong direction of said trench groove, said injection angle $\alpha$ being selected for injecting only into said first side wall;
   obliquely ion-injecting impurity atoms of said first conductivity type at said injection angle $\alpha$ into a second side wall which is parallel to said oblong direction but disposed opposite said first side wall; and
   obliquely ion-injecting impurity atoms of said first conductivity type at an injection angle $\beta$ in the direction of said end wall and in the direction of a bottom face;
   forming a charge transfer region comprising the steps of:
   obliquely ion-injecting impurity atoms of a second conductivity type at an injection angle $\alpha$ into said first side wall;
   obliquely ion-injecting impurity atoms of said second conductivity type at said injection angle $\alpha$ into said second side wall; and
   obliquely ion-injecting impurity atoms of said second conductivity type at an injection angle $\gamma$ into said end wall and also into said bottom face;
   forming insulation films on the wall faces of said trench groove; and
   forming plural charge transfer electrodes on the wall faces covered by said insulation films.

2. A method for making a semiconductor device comprising the steps of:
   etching a semiconductor substrate to form an oblong trench groove having an end wall;
   obliquely ion-injecting impurity atoms of a first conductivity type, at an injection angle $\alpha$ of less than $\pi/4$, to the side walls of said oblong trench groove disposed in oblong direction;
   obliquely ion-injecting impurity atoms of said first conductivity type at an injection angle $\beta$ to said end wall of said trench groove; and
   obliquely ion-injecting impurity atoms of a second conductivity type which is opposite to said first conductivity type at an injection angle $\gamma$ to said end wall,
   said injection angles holding the relation:

$$\beta + \gamma = \pi/2$$

and $$\beta \leq \gamma.$$

3. A method for making a semiconductor device comprising the steps of:
   etching a semiconductor substrate to form an oblong trench groove having an end wall;
   forming an electric isolation region comprising the steps of:
   obliquely ion-injecting impurity atoms of a first conductivity type at an injection angle $\alpha$ with an impurity dose Npi($\alpha$) into a first side wall which is parallel to an oblong direction of said trench groove, said injection angle $\alpha$ being only in the direction of said first side wall;
   obliquely ion-injecting impurity atoms of said first conductivity type at said injection angle $\alpha$ with said impurity dose Npi($\alpha$) into a second side wall which is parallel to said oblong direction but disposed opposite said first side wall;
   obliquely ion-injecting impurity atoms of said first conductivity type at an injection angle $\beta$ with an impurity dose Npi($\beta$) into said end wall and also into the bottom face; and
   activating said impurity atoms of said first conductivity type injected into said first side wall and said second side wall thereby to produce impurity doses Npi($\alpha$,x) at the depth x from the surface of said side walls and also to produce impurity doses Npi($\beta$,x) at the depth x from the surface of said end wall and said bottom face,
   wherein impurity doses Npi($\alpha$,x)·sin $\alpha$ of said side walls, impurity dose Npi($\beta$,x)·sin $\beta$ of said end wall and impurity dose Npi($\beta$,x)·cos $\beta$ of said bottom face are defined by the following relation:

$$Npi(\beta,x)\cdot\sin \beta \leq Npi(\beta,x)\cdot\cos \beta \leq Npi(\alpha,x)\cdot\sin \alpha;$$

forming a charge transfer region comprising the steps:

obliquely ion-injecting impurity atoms of a second conductivity type which is opposite to said first conductivity type at said injection angle $\alpha$ with an impurity dose Nni($\alpha$) into said first side wall;

obliquely ion-injecting impurity atoms of said second conductivity type at said injection angle $\alpha$ with said impurity does Nni($\alpha$) into said second side wall;

obliquely ion-injecting impurity atoms of said second conductivity type at an injection angle $\gamma$ with an impurity dose Nni($\gamma$) into said end wall and also into said bottom face; and activating said impurity atoms of said second conductivity type injected into said first side wall and said second side wall thereby to produce impurity doses Nni($\alpha$,y) at depth y from a surface of said side walls and also to produce impurity doses Nni($\gamma$,y) at depth y from a surface of said end wall and said bottom face, wherein impurity doses Nni($\gamma$,y)·sin $\alpha$ of said side walls, impurity dose Nni($\gamma$,y)·sin $\pi$ of said end wall and impurity dose Nni($\gamma$,y)·cos $\pi$ of said bottom face are defined by the following relation:

$$Nni(\gamma,y)\cdot\cos \tau \leq Nni(\alpha,y)\cdot\sin \alpha \leq Nni(\gamma,y)\cdot\sin \lambda;$$

forming insulation films on the wall faces of said trench groove; and forming plural charge transfer electrodes on the wall faces covered by said insulation films.

* * * * *